(12) United States Patent
Gerhart et al.

(10) Patent No.: US 12,393,240 B2
(45) Date of Patent: Aug. 19, 2025

(54) SYSTEM AND METHOD FOR GRANULAR AND DYNAMIC CONTROL OF FAN SPEED AND DIRECTION

(71) Applicant: Dell Products L.P., Round Rock, TX (US)

(72) Inventors: Donald W. Gerhart, Leander, TX (US); Timothy M. Lambert, Austin, TX (US); Jeffrey Leighton Kennedy, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 394 days.

(21) Appl. No.: 18/047,817

(22) Filed: Oct. 19, 2022

(65) Prior Publication Data
US 2024/0134430 A1    Apr. 25, 2024
US 2024/0231452 A9    Jul. 11, 2024

(51) Int. Cl.
*G06F 1/20*    (2006.01)
*H05K 7/20*    (2006.01)

(52) U.S. Cl.
CPC ......... *G06F 1/206* (2013.01); *H05K 7/20209* (2013.01)

(58) Field of Classification Search
CPC ........... G05B 15/02; G06F 1/206; G06F 1/20; H05K 7/20209
USPC ........................................................ 700/300
See application file for complete search history.

(56) References Cited

U.S. PATENT DOCUMENTS

| | | | |
|---|---|---|---|
| 6,389,817 B1 * | 5/2002 | Smith | F25B 21/04 62/3.2 |
| 7,698,095 B2 | 4/2010 | Chung et al. | |
| 8,550,702 B2 | 10/2013 | Campbell et al. | |
| 9,581,985 B2 | 2/2017 | Walser et al. | |
| 9,772,664 B1 | 9/2017 | Chou et al. | |
| 9,785,208 B2 | 10/2017 | Lovicott et al. | |
| 9,820,411 B2 | 11/2017 | Alshinnawi et al. | |
| 9,842,003 B2 | 12/2017 | Rao et al. | |
| 9,968,011 B2 | 5/2018 | Shabbir et al. | |
| 10,156,987 B1 | 12/2018 | Gutierrez et al. | |
| 10,191,523 B2 | 1/2019 | Shows et al. | |
| 10,394,294 B2 | 8/2019 | Pfeifer et al. | |
| 10,712,033 B2 | 7/2020 | Atchison et al. | |
| 10,760,809 B2 | 9/2020 | Gillette et al. | |
| 11,009,249 B2 | 5/2021 | Goel et al. | |

(Continued)

*Primary Examiner* — Chun Cao
(74) *Attorney, Agent, or Firm* — WOMBLE BOND DICKINSON (US) LLP (57) ABSTRACT

Methods and systems for thermal management of data processing systems are disclosed. To improve the likelihood of computer implemented services being provided, the systems may thermally manage the temperatures of various components of the data processing system under a variety of operating conditions. To warm the components, the system may include fans usable to generate a circulation airflow and heaters to generate heat to warm the airflow. To cool the components, the system may include fans usable to generate a through enclosure airflow to bring in cool air and expel warm air. The fans may be managed via a control system that includes multiple management entities that may operate under different ranges of thermal conditions and may be capable of performing various analysis for ascertaining how to operate the fans and heaters to thermally manage the system.

20 Claims, 8 Drawing Sheets (56) References Cited

U.S. PATENT DOCUMENTS

| | | | |
|---|---|---|---|
| 2002/0030239 A1* | 3/2002 | Der Ropp | H01L 23/345 257/467 |
| 2009/0198387 A1* | 8/2009 | Lin | G06F 1/26 713/2 |
| 2011/0296155 A1* | 12/2011 | Belady | G06F 9/44 713/300 |
| 2012/0223666 A1* | 9/2012 | Huang | F04D 27/004 318/472 |
| 2013/0015548 A1 | 1/2013 | Chen et al. | |
| 2014/0027435 A1 | 1/2014 | Chou | |
| 2015/0373876 A1* | 12/2015 | Berke | G05D 23/1919 700/282 |
| 2020/0042056 A1* | 2/2020 | Shabbir | G05B 15/02 |
| 2020/0097055 A1* | 3/2020 | Wang | G05B 15/02 |
| 2020/0286804 A1 | 9/2020 | Fallin et al. | |
| 2021/0103305 A1 | 4/2021 | Nikazm et al. | |
| 2022/0413573 A1* | 12/2022 | Chiu | G06F 1/20 |
| 2023/0086310 A1* | 3/2023 | Utz | G06F 1/182 700/202 |
| 2023/0260864 A1* | 8/2023 | Kondapuram | H05B 1/023 713/2 |

\* cited by examiner

SYSTEM AND METHOD FOR GRANULAR AND DYNAMIC CONTROL OF FAN SPEED AND DIRECTION

FIELD OF THE DISCLOSURE

Embodiments disclosed herein generally relate to thermal management. More particularly, embodiments disclosed herein relate to thermal management in variable temperature environments.

BACKGROUND

Computing devices may store data and used stored data when performing computations. For example, computing devices may utilize data when providing computer implemented services. To provide the computer implemented services, the computing devices may consume electrical power to perform the computations. The consumed electrical power may generate heat.

BRIEF DESCRIPTION OF THE DRAWINGS

Embodiments disclosed herein are illustrated by way of example and not limitation in the figures of the accompanying drawings in which like references indicate similar elements.

DETAILED DESCRIPTION

Various embodiments and aspects of the disclosure will be described with reference to details discussed below, and the accompanying drawings will illustrate the various embodiments. The following description and drawings are illustrative of the embodiments and are not to be construed as limiting. Numerous specific details are described to provide a thorough understanding of various embodiments. However, in certain instances, well-known or conventional details are not described in order to provide a concise discussion of embodiments.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments of the invention relate to methods and systems for thermal management of data processing systems that may be used to provide computer implemented services. Specifically, the disclosed thermal management method and systems may improve the likelihood of data processing systems providing desired computer implemented services by retaining and/or returning the components of the data processing systems within their thermal operating ranges.

To improve the likelihood of the computer implemented services being provided, the systems may include fans and a control system to manage the rate and direction of airflows generated by the fans. The rate and direction of airflow generated by the fans may be modified to generate various types of airflows including, for example, circulations and through-enclosure flows. These different flows may be used, for example, to heat various components and cool various components, respectively.

To manage the fans during periods of time where various management components of the data processing system may not be operating due to their thermal condition, the control system may include multiple management entities having different thermal operating ranges. While one or more of the management entities may not be operable due to their thermal states, other management entities may generate and direct control signals to the fans and/or heating units.

To manage the control signals generated by the management entities, the control system may provide for arbitration of control over fans and heating units of the data processing system. For example, the control system may selectively direct control signals from different types of management entities to the fans and/or heating units based on the operating states of these components. By doing so, control over the fans and/or heating units may be arbitrated so that the management entity that is the most capable of managing the fans/heating unit and is operational may have authority to manage the fans/heating units.

By doing so, embodiments disclosed herein may provide a data processing system that is more likely to be able to provide computer implemented services across a wider range of temperatures than competing devices. Additionally, the data processing system may, through arbitration, be capable of failing over between multiple management entities thereby reducing the impact of failures of management entities on the operation of the data processing system.

In an embodiment, a data processing system to provide computer implemented services is provided. The data processing system may include hardware resources for providing the computer implemented services; a heating unit adapted to selectively heat an interior of an enclosure in which the hardware resources are positioned; fans adapted to selectively generate airflow from an ambient environment through the enclosure; a fan controller adapted to manage operation of the fans and operation of the heating unit based on instructions from a temperature sensitive management controller or the temperature insensitive thermal manager; a temperature sensitive management controller adapted to provide the instructions to the fan controller while the temperature sensitive management controller is operating;

and a temperature insensitive thermal manager adapted to direct, by providing the instructions to the fan controller, the operation of the heating unit and the operation of the fans while an internal ambient temperature of the data processing system is outside of operation limitations of the temperature sensitive management controller.

The data processing system may also include an arbiter adapted to operably connect one of the temperature sensitive management controller and the temperature insensitive thermal manager to the fan controller at a time, wherein the operable connection allows the instructions to be obtained by the fan controller.

The data processing system may further include a multiplexer that selectively directs first signals from the temperature sensitive management controller to the fan controller or second signals from the temperature insensitive thermal manager to the fan controller. The multiplexer may receive a select signal from the arbiter to select which of the first signals and the second signals to direct to the fan controller at a time.

Operably connecting one of the temperature sensitive management controller and the temperature insensitive thermal manager may include identifying an operating state of the temperature sensitive management controller and the temperature insensitive thermal manager; when, based on the operating state, the temperature sensitive management controller is operational, modifying the select signal to select the first signals for direction to the fan controller; and when, based on the operating state, the temperature sensitive management controller is not operation and the temperature insensitive thermal manager is operational, modifying the select signal to select the second signals for direction to the fan controller.

The fan controller may include a plurality of independent control outputs operably connected to the fans. The control outputs may facilitate speed and direction of airflows generated by the fans.

The fans may include a pair of circulation fans for generating a circulatory airflow within the interior. The pair of circulation fans may be positioned with each other and to generate airflows in different directions when operating. The pair of circulation fans may be positioned with a gas intake in the enclosure or a gas exhaust in the enclosure.

Directing the operation of the heating unit and the operation of the fans may include: making a determination that an instance of the internal ambient temperature is outside of the operation limitations of the temperature sensitive management controller; based on the determination: sending first instructions to the fan controller, the first instructions directing a first fan of the fans to operate in a first direction to generate a first airflow; sending second instructions to the fan controller, the second instructions directing a second fan of the fans to operating in a second direction to generate a second airflow; and initiating heat generation via the heating unit while the first airflow and the second airflow are generated.

The first fan and the second fan may be positioned so that the first airflow and the second airflow generate a circulation airflow within the interior of the enclosure. The circulation airflow may be heated by the heat generation by the heating unit to warm, at least, the temperature sensitive management controller.

The temperature sensitive management controller may be inactive while the first airflow and the second airflow are generated.

Providing the instructions to the fan controller while the temperature sensitive management controller is operating may include inventorying the data processing system to obtain a hardware component inventory; selecting operating set points for the fans to establish an airflow through the interior; generating the instructions based on the operating points; and sending the instructions to the fan controller via a multiplexer of the data processing system, the multiplexer multiplexing communications from the temperature sensitive management controller and the temperature insensitive thermal manager to the fan controller.

In an embodiment, a method of thermally managing a data processing system that provides computer implemented services is provided. The method may include identifying a startup of the data processing system; identifying an internal ambient temperature of the data processing system; making a determination regarding whether the internal ambient temperature is within operation limitations of a thermally sensitive management controller of the data processing system; in a first instance of the determination where the internal ambient temperature is not within the operation limitations: performing a first action set to raise the internal ambient temperature until the internal ambient temperature is within the operation limitations; in a second instance of the determination where the internal ambient temperature is within the operation limitations: performing a second action set to maintain the internal ambient temperature within the operation limitations.

The method may also include preventing the thermally sensitive management controller from operating until the internal ambient temperature is within the operation limitations.

Performing the first action set may include initiating generation of a circulatory airflow within an interior of an enclosure of the data processing system; and initiating heat generation to warm the circulatory airflow.

Performing the second action set may include terminating the circulatory airflow and the heat generation; and initiating generation of an airflow through the interior of the enclosure from an ambient environment around the enclosure.

Terminating the circulatory airflow may include disabling communications between a thermally insensitive management controller performing the first action set; and enabling communications between the thermally sensitive management controller after it begins to operate.

Initiating the generation of the circulatory airflow may include instructing a fan manager that manages two fans to generate airflows in different directions, the airflows comprising the circulatory airflow.

Initiating the heat generation may include powering an electric heater positioned to heat the circulatory airflow.

Generating airflows in different directions may include independently powering the two fans.

In an embodiment, a non-transitory computer readable medium storing instructions that, when executed by a processor, cause a method thermally managing a data processing system providing computer implemented services is provided. The method may be similar to that discussed above.

Figure 1A:
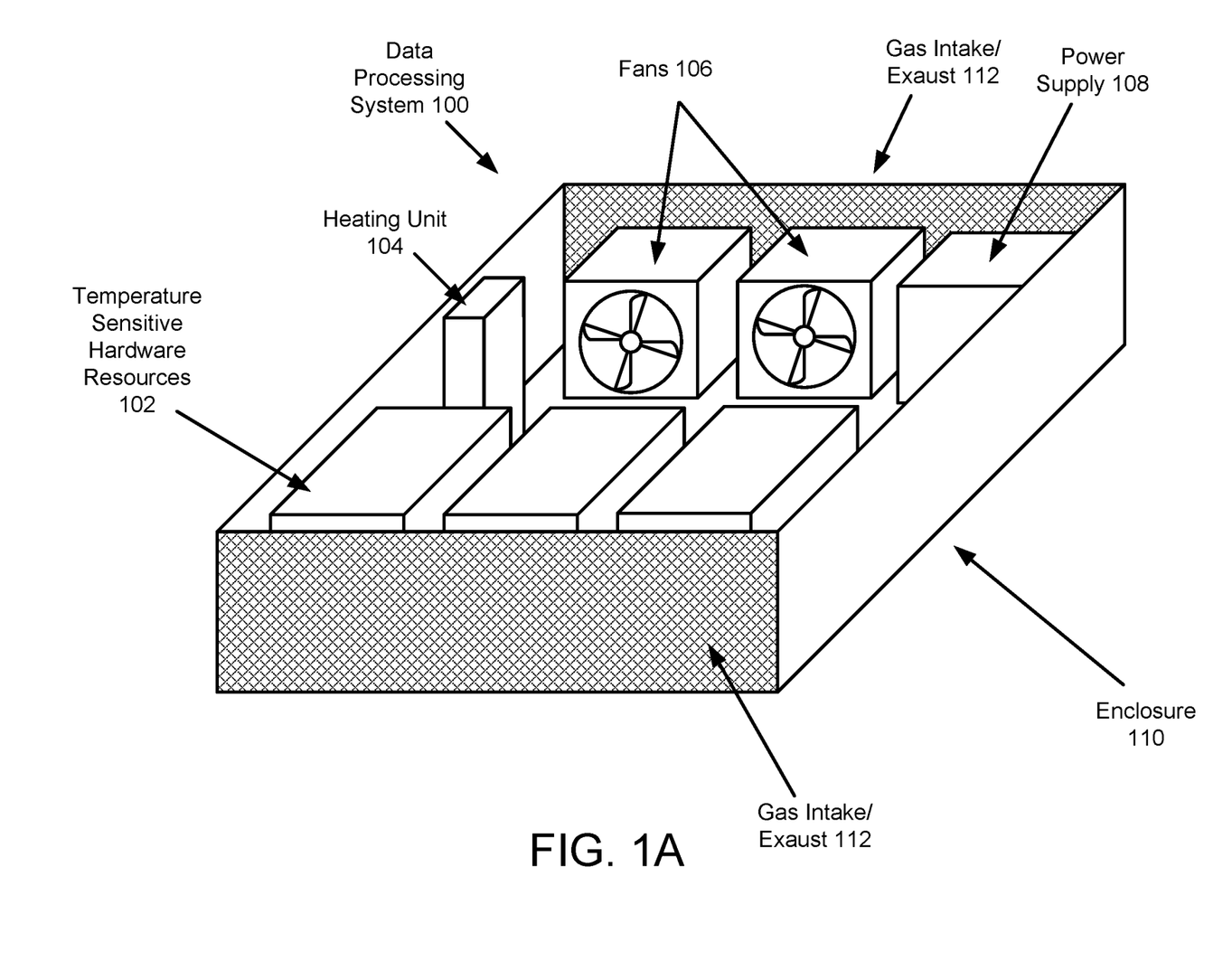
FIG. 1A shows a diagram illustrating a data processing system in accordance with an embodiment.

Turning to FIG. 1A, a diagram illustrating a system in accordance with an embodiment is shown. The system shown in FIG. 1A may be used to provide computer implemented services. The system may include, but is not limited to, data processing system 100. Each of these components is discussed below.

Data processing system 100 may provide the computer implemented services. When doing so, data processing system 100 may consume electrical power from other sources (e.g., via power supply 108 or another device external to the data processing system, either of which may obtain power from a utility grid or other source). To provide the computer implemented services, data processing system 100 may include various types of hardware resources.

The hardware resources may include any number of physical devices (e.g., processors, memory modules, storage devices, communications devices, etc.) that provide computing resources (e.g., processor cycles, transitory storage, persistent storage, communications bandwidth, etc.) usable to provide the computer implemented services. The computing resources may be used to support applications (e.g., computing instructions executing with the computing resources) hosted by data processing system 100. The applications may provide the computer implemented services. The computer implemented services may include any type and quantity of computer implemented services such as, for example, database services, data storage services, electronic communications services, etc. Data processing system 100 may provide other types of computer implemented services without departing from embodiments disclosed herein.

When operating, the hardware resources may consume electrical power to provide the computing resources used to provide the computer implemented services. The hardware resources may utilize power from power supply 108, and/or other sources. Power supply 108 may include any number of physical devices (e.g., transformers, current/voltage sensors, controllers, etc.) usable to obtain power from other power sources (not shown) and provide conditioned power to the hardware resources and/or other components. The power obtained from the other power sources may be any form of power (e.g., alternating current, direct current) but the conditioned power may have specific characteristics (e.g., direct current of a predetermined voltage level) based on the hardware resources.

The hardware resources may generate heat when providing their functionality. For example, the hardware resources may consume power when providing computing resources and generate heat as a byproduct. Generally, the hardware resources and/or other components of data processing system 100 may have associated thermal ranges in which the hardware resources are capable of operating (e.g., at high reliability). If the temperatures of various portions of the hardware resources fall outside of the thermal ranges, then the corresponding portions of the hardware resources may fail to operate (e.g., as intended/expected), may operate with some impairment (e.g., reduced rate, increased error rates in operation, etc.), or may otherwise operate in a manner that may impair (partially or entirely) the ability of data processing system 100 to provide the computer implemented services. Consequently, at least a portion of the hardware resources may be temperature sensitive hardware resources 102 (collectively with other types of temperature sensitive devices such as management controllers being referred to as "temperature sensitive components") that may need to be heated and/or cooled to maintain temperature within associated thermal ranges.

To manage the temperatures of the temperature sensitive components (e.g., temperature sensitive hardware resources 102, management controllers (not shown), etc.), data processing system 100 may include one or more fans 106 and heating unit 104. Data processing system 100 may include any number and types of fans 106 and heating unit 104.

Fans 106 may thermally manage hardware resources and/or other components within enclosure 110 by selectively generating flows of gas proximate to the temperature sensitive components to cool them. While illustrated in FIG. 1A with respect to specific numbers and placements, the locations and number of individual fans of fans 106 may be different from that shown in FIG. 1A without departing from embodiments disclosed herein.

When operating, fans 106 may draw gasses into enclosure through one or more of gas intake/exhaust 112 (e.g., drawn with cross-hatch fill in FIG. 1A), exhaust gasses out of the gas intake/exhaust 112, and/or otherwise establish flows of gasses. For example, cool gases from an ambient environment may be drawn in through the front of enclosure 110 via one gas intake/exhaust, flow the cool gases by the temperature sensitive components. While illustrated in FIG. 1 as covering the front and/or rear of enclosure 110, it will be understood that gas intake/exhaust 112 may be of different sizes and may only extend across portions of the front/rear of enclosure 110. Gas intake/exhaust 112 may be implemented with, for example, one or more holes through enclosure 110, screens to limit physical access and/or electromagnetic interference (EMI) leakage, and/or other physical components.

In an embodiment, fans 106 include functionality to modulate the rate of gas flows generated by their operation. For example, a fan may include a motor (e.g., electric) and one or more blades. The rate at which the blades move gasses thereby generating a gas flow may be dependent on the rotation rate of the motor. The rate of rotation of the motor may depend on the quantities of voltage and current with which fans 106 are driven. In an embodiment, the fans 106 are driven with a pulse width modulated voltage. The duty cycle (e.g., ratio of on to off time during each cycle of the pulse width modulated voltage) of the pulse width modulated voltage may control the rate at which fans 106 rotate (e.g., within certain limitations, fans 106 may rotate at a predetermined maximum rate with a 100% duty cycle and at reduced rates depending on the duty cycle). Additionally, the direction of current flow provided to the fan may control the direction of rotation of the electric motor thereby allow for the fan to generate a forward or reverse flow of gas, depending on the direction of the supplied current.

To manage the operation of fans 106, fans 106 may include tachometers to report operating points (e.g., rotation rates) to other entities (e.g., management controllers, thermal managers, etc.). The tachometers (or other types of sensors) may generate an electrical signal corresponding to the operating points of fans 106. For example, the tachometers generate pulse trains at a rate corresponding to their respective operating points. These signals may be directed to management entities (e.g., fan managers), which may be used to manage the rotation rates of the fans.

Heating unit 104 may selectively generate heat which may be used to warm the temperature sensitive components. Heating unit 104 may be implemented with, for example, a resistive heating element that consumes electrical power (e.g., from power supply 108) and generates heat.

In general, embodiments disclosed herein relate to system, methods, and devices for managing components of a data processing system to provide computer implemented services. To do so, the data processing system may consider the temperatures of temperature sensitive components when deciding (i) whether to power each component, (ii) whether and how to operate fans to cool and/or heat the temperature sensitive components, and (iii) whether to generate heat to heat the temperature sensitive components. By doing so, embodiments disclosed herein may provide a data processing system that is more likely to provide desired computer implemented services under a variety of environmental conditions.

For example, consider a scenario where data processing system 100 is used as an edge node positioned in an environment in which the ambient temperature fluctuates. The ambient temperature may fluctuate below the operating temperature range of one or more temperature sensitive components. If the temperature sensitive components attempt to operate under these conditions, then the temperature sensitive components may malfunction, may damage themselves, and/or may otherwise operate in other undesired manners.

To reduce the likelihood of temperature sensitive components malfunctioning, being damaged, and/or otherwise operate in undesired manners, data processing system 100 may (i) monitor the temperatures of the temperature sensitive components (and/or other components), (ii) operate fans 106 and/or heating unit 104 if the temperatures fall outside of the operating temperature ranges of the temperature sensitive components to address temperatures that may impact operation of the temperature sensitive components, and (iii) implement a distributed framework for managing operation of fans 106 and heating unit 104 using a range of devices able to operate under different operating temperature ranges. Fans 106 and heating unit 104 may be individually controllable, and may be positioned to generate a variety of types of different airflows (e.g., circulations, through enclosure, etc.) depending on the operation of these devices. By doing so, embodiments disclosed herein may provide a data processing system that is more likely to operate successfully across a range of ambient environmental conditions.

Figure 1B:
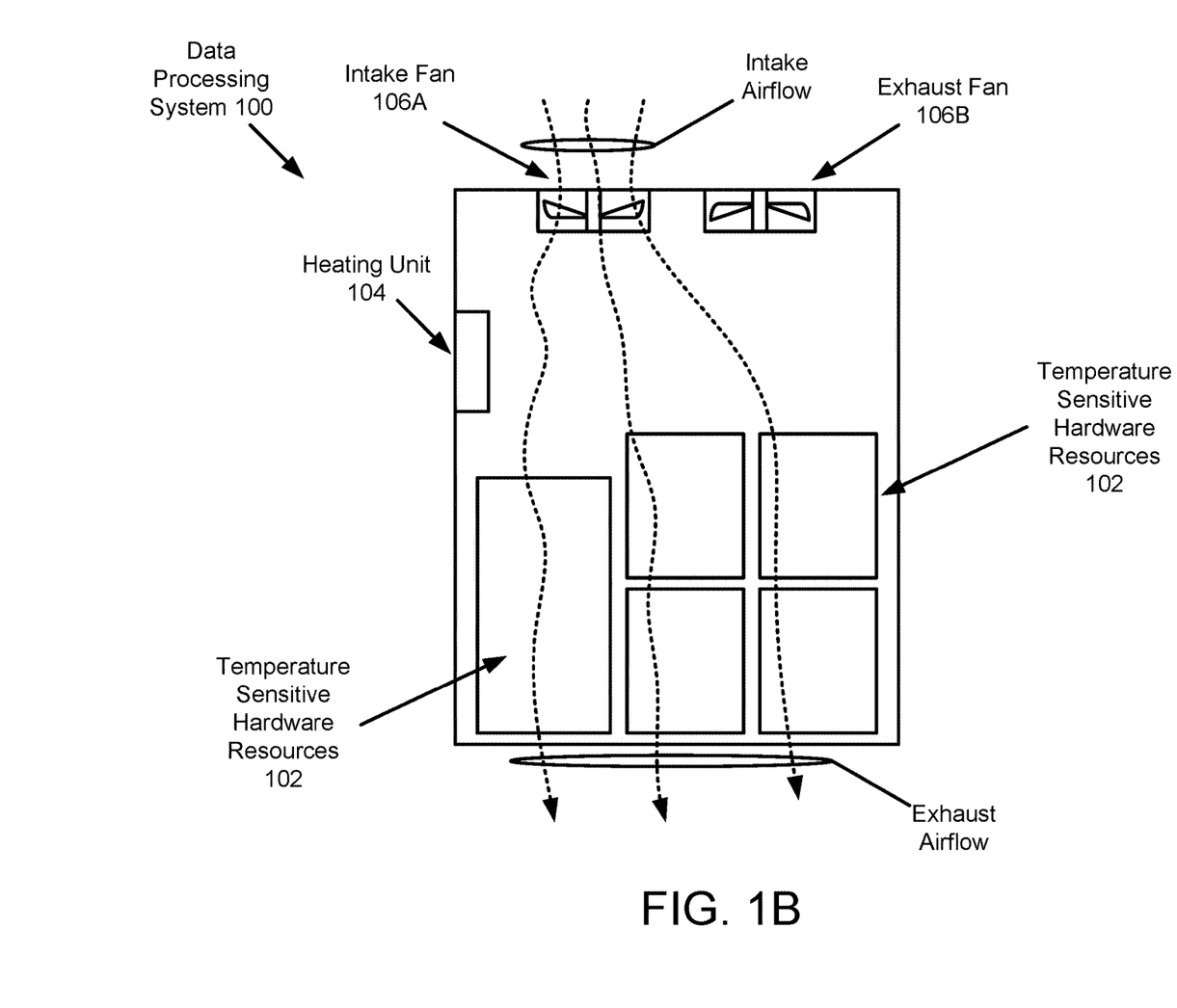
FIG. 1B shows a diagram illustrating a first flow of gas in a data processing system in accordance with an embodiment.
Figure 1C:
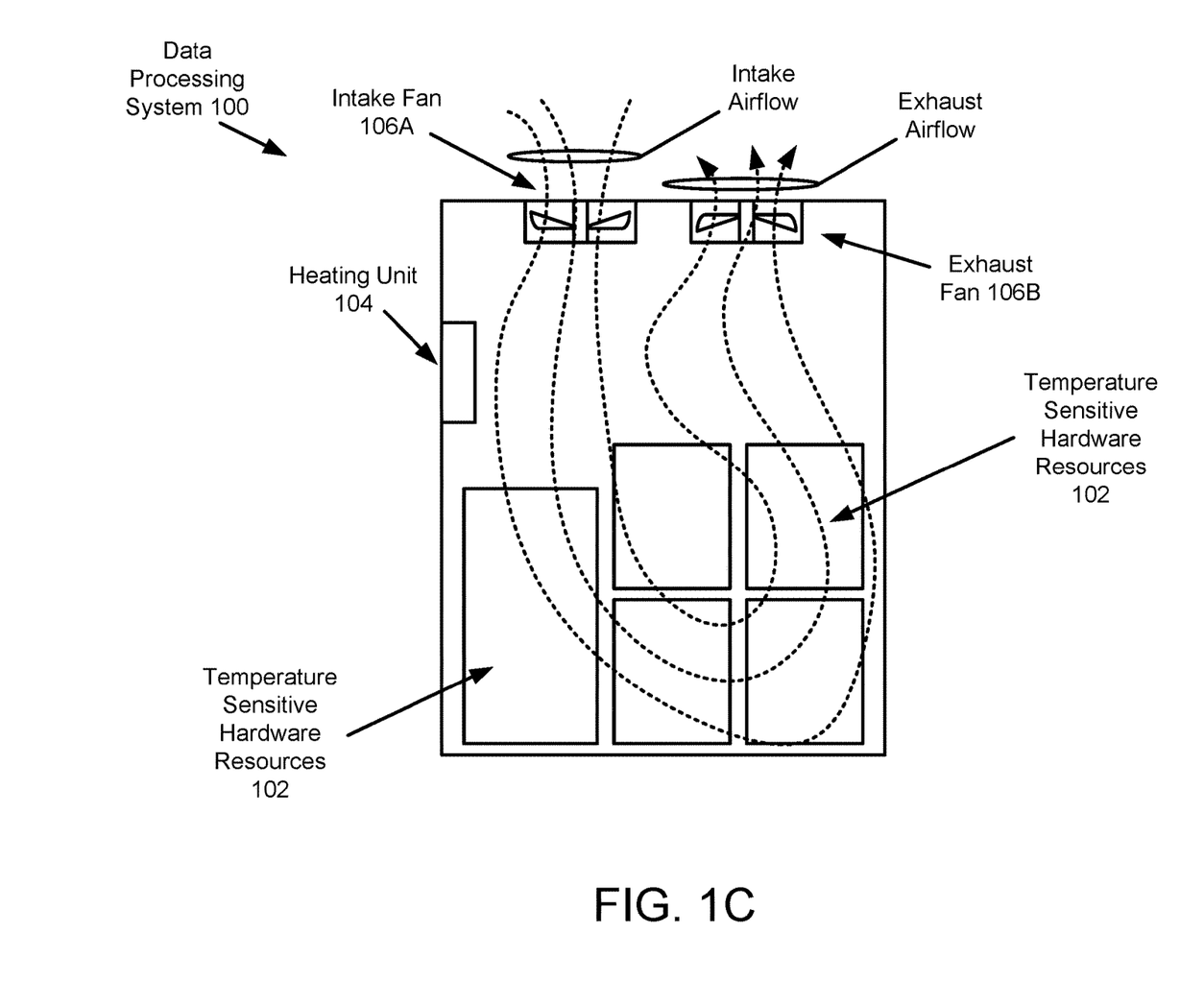
FIG. 1C shows a diagram illustrating a second flow of gas in a data processing system in accordance with an embodiment.
Figure 1D:
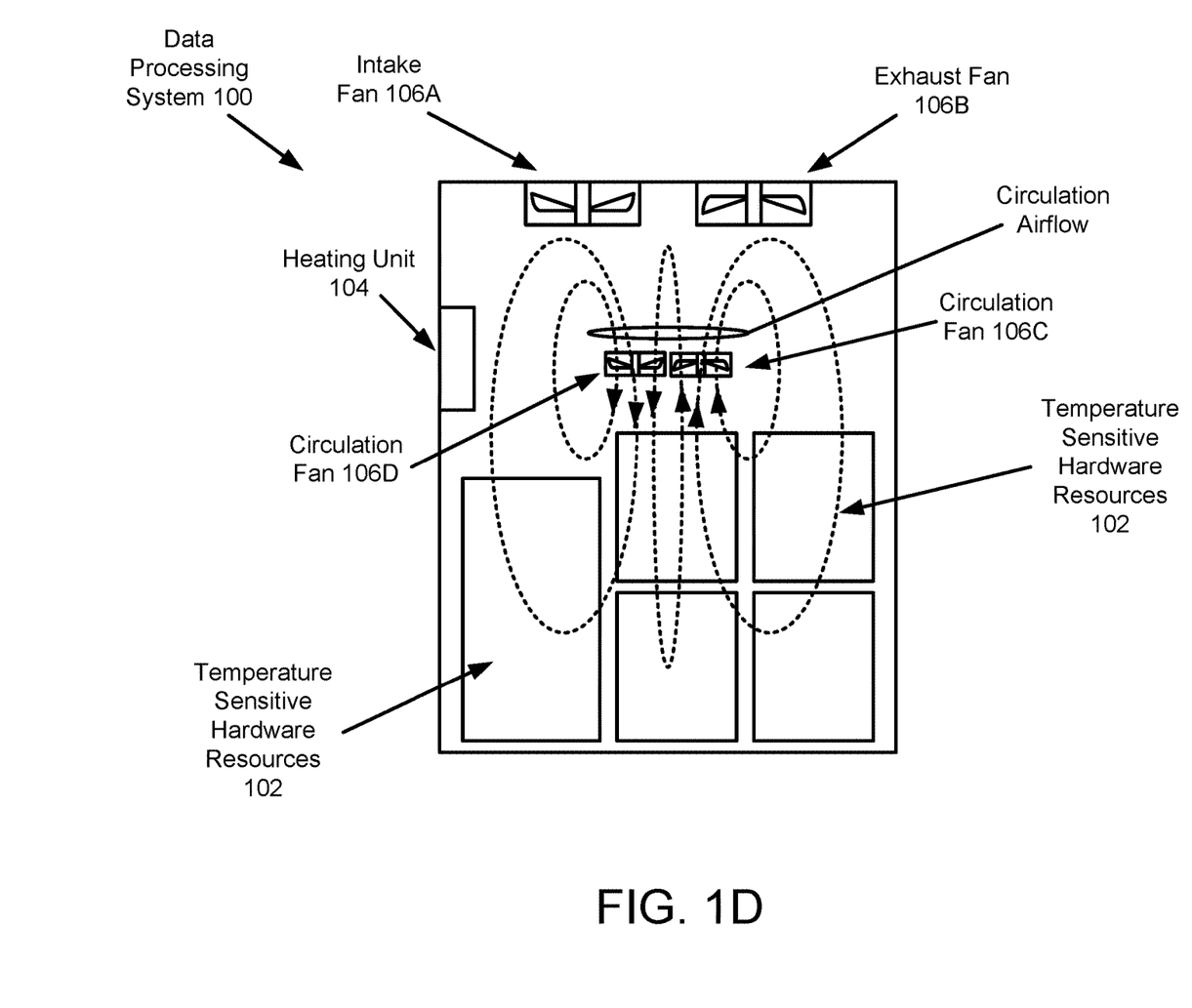
FIG. 1D shows a diagram illustrating a second flow of gas in a data processing system in accordance with an embodiment.
Figure 2:
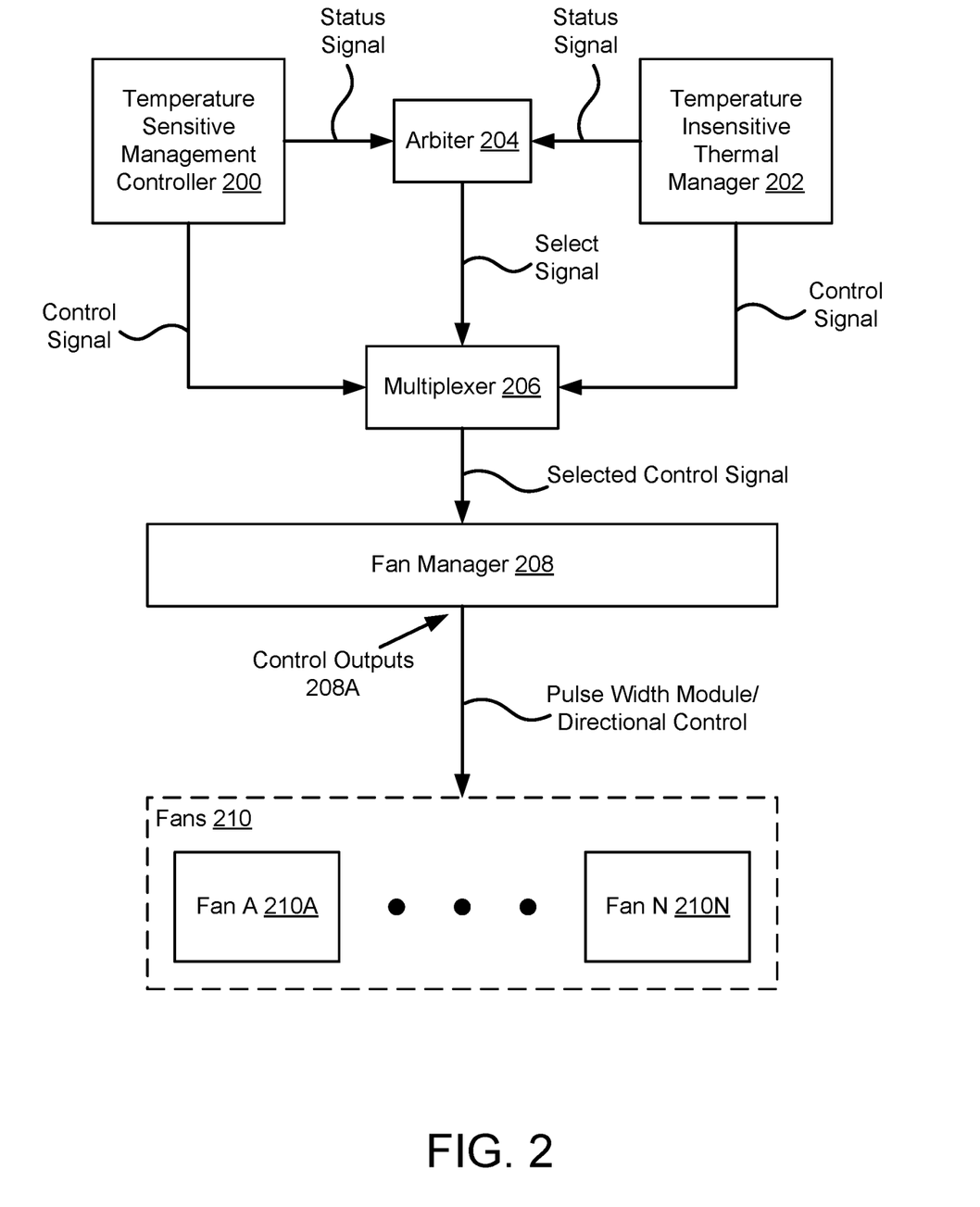
FIG. 2 shows a block diagram illustrating a control system in accordance with an embodiment.

Refer to FIG. 2 for additional details regarding the distributed management framework of data processing system 100, and to FIGS. 1B-1D for additional details regarding flows of gasses within data processing system 100 usable to thermally manage various components positioned in enclosure 110.

Enclosure 110 may include a physical structure for housing various components of data processing system 100. The physical structure may be a form factor compliant structure such as, for example, a rack mount enclosure for a server, edge device, or other type of computing device. The physical structure may be other types of structures for housing data processing systems without departing from embodiments disclosed herein.

Data processing system 100 may be implemented with a computing device such as a host or server, a personal computer (e.g., desktops, laptops, and tablets), a "thin" client, a personal digital assistant (PDA), a Web enabled appliance, or a mobile phone (e.g., Smartphone), and/or any other type of data processing device or system. For additional details regarding computing devices, refer to FIG. 4.

While the system of FIG. 1A has been illustrated as including a limited number of specific components, a data processing system may include different numbers, types, and/or quantities of components without departing from the embodiments disclosed herein.

As noted above, flows of gas (e.g., air from an ambient environment or other source) may be used to cool and/or warm various components positioned within data processing system 100. FIGS. 1B-1D show top view block diagrams of data processing system 100 and example flows of gasses (e.g., airflows) in accordance with an embodiment.

Turning to FIG. 1B, a top view block diagram of a data processing system in accordance with an embodiment is shown in FIG. 1B. As discussed above, embodiments disclosed herein may improve the likelihood of a data processing system providing computer implemented services by improving the thermal management of the components of the data processing system that provide the computer implemented services.

To thermally manage components of data processing system 100, data processing system may include intake fan 106A and exhaust fan 106B. When intake fan 106A is operating, air may flow through the interior of data processing system 100. In FIG. 1B, the airflow is illustrated using arrows with dashed tails to indicate direction and flow path. For example, an intake airflow may be drawn into data processing system 100 through intake fan 106A and exhausted out of data processing system 100 as an exhaust airflow. By doing so, thermal exchange between the flow of gas and temperature sensitive components (e.g., temperature sensitive hardware resources 102 and/or other devices not shown in FIG. 1B) may be used to cool the temperature sensitive components.

However, if the ambient temperature is sufficiently low, the temperatures of the thermally sensitive components may be below the operating temperatures ranges of the components. For example, consider a scenario where data processing system 100 is positioned in an edge deployment where conditioned air is unavailable and air from an ambient environment is used to cool data processing system 100. In the scenario, the temperature of the ambient environment may be so low that various components of data processing system 100 may not be reliably operated.

To place the temperature sensitive components within their operating temperature ranges, heating unit 104 may be activated which may heat, to some extent, the flow of air generated by intake fan 106A. However, due to heat generation limits, the temperature of the airflow through the interior of data processing system 100 may not be significantly increased above the ambient temperature. This may result in the heated airflow being insufficient to heat the temperature sensitive components to within their operating temperature ranges.

To further heat such temperature sensitive components, data processing system 100 may include functionality to generate other types of airflows that are conducive to heating. To do so, data processing system 100 may include functionality to individually control different fans (e.g., both in terms of duty cycle and direction of airflow generation through application of current in different directions). Refer to FIGS. 1C-1D for additional details regarding generation of different types of airflows.

Turning to FIG. 1C, a second top view block diagram of a data processing system (e.g., similar to that shown in FIG. 1B) in accordance with an embodiment is shown. To further increase the heating capability of the airflow within data processing system 100, both intake fan 106A and exhaust fan 106B may be operated at the same time thereby generating circulation of airflow within data processing system 100. An example airflow path is illustrated using arrows with dashed tails. It will be appreciated that the airflow path may be different from that illustrated in FIG. 1C without departing from embodiments disclosed herein.

As seen in FIG. 1C, an intake airflow may be drawn in through intake fan 106A. The airflow may circulate within data processing system 100 thereby providing more time for thermal exchange with heating unit 104 and temperature sensitive components to occur. The airflow may exhaust out via exhaust fan 106B as an exhaust airflow.

Turning to FIG. 1D, a third top view block diagram of a data processing system (e.g., similar to that shown in FIG. 1B) in accordance with an embodiment is shown. To further increase the heating capability of the airflow within data processing system 100, data processing system include circulation fans (e.g., 106C, 106D). Circulation fans may be positioned near one another and may generate airflows in different directions. These airflows, as illustrated in FIG. 1D, may substantially circulate within the interior of data processing system 100. Consequently, heating unit 104 may heat the circulating airflow with reduced loss of heated airflow to the ambient environment, when compared to the topology of data processing system 100 illustrated in FIG. 1C. Consequently, data processing system 100 as illustrated in FIG. 1D may be capable of substantially increasing the temperatures of the components of data processing system 100.

For example, prior to activating intake fan 106A or exhaust fan 106B, data processing system 100 may activate both heating unit 104 and the circulation fans (e.g., 106C, 106D). When activated, a circulating airflow, as illustrated by the dashed lines with arrows, may be generated. The circulating airflow may be heated by heating unit 104 and may distribute the generated heat to the components of data processing system 100 (e.g., at least those within the enclosure of data processing system 100).

While illustrated and described as creating specific airflows with respect to FIGS. 1A-1D, it will be understood that the fans of a data processing system may be capable of generating airflows in different directions (e.g., by applying different currents flow directions to the fans), and may also be capable of generating varying rates of airflow. Consequently, data processing system 100 may include fans capable of generating a variety of airflows that may be modified to establish thermal environments conducive to heating and/or cooling of various components of data processing system 100.

To manage the operation of the fans, data processing system 100 may include multiple management components. FIG. 2 shows a diagram of a control system of a data processing system that may be used to manage the operation of the fans in accordance with an embodiment. The control system may include temperature sensitive management controller 200, temperature insensitive thermal manager 202, arbiter 204, multiplexer 206, fan manager 208, and fans 210. Each of these components is discussed below.

Temperature sensitive management controller 200 may, while operating, manage the operation of fans 210 and/or other components (e.g., heating units) of a data processing system. For example, temperature sensitive management controller 200 may obtain information regarding the thermal states of components of a data processing system and/or of an ambient environment, and make decisions regarding how to operate temperature control components such as fans and heating units. The decisions may be made to improve the likelihood of the components of the data processing system performing their functionalities by heating and/or cooling them to attempt to keep them within their operating temperature ranges.

To implement the decisions, temperature sensitive management controller 200 may output one of more control signals to multiplexer 206. Temperature sensitive management controller 200 may also output a status signal to arbiter 204 indicating when temperature sensitive management controller is operating.

In an embodiment, temperature sensitive management controller 200 is implemented with a management controller (e.g., out of band and/or in band), another type of programmable device, and/or other types of hardware devices. Temperature sensitive management controller 200 may have a limited operating temperature range, and may be sensitive to operation in temperatures outside of these temperature ranges. Generally, the data processing system hosting temperature sensitive management controller 200 may not power it while its temperature is outside of its operating temperature range. Consequently, the control signal provided by temperature sensitive management controller may not always be present.

Temperature insensitive thermal manager 202 may, like temperature sensitive management controller 200, manage the operation of fans 210 and/or other components (e.g., heating units) of a data processing system. However, unlike temperature sensitive management controller 200, temperature insensitive thermal manager 202 may include more limited functionality. For example, temperature insensitive thermal manager 202 may not be capable of performing complex algorithms for ascertaining how to manage fans 210 and/or other components. Thus, while operating, temperature insensitive thermal manager 202 may generate control signals based on reduced complexity control algorithms which may not be as capable for management of the thermal management components.

Temperature insensitive thermal manager 202 may also output a status signal to arbiter 204 indicating when temperature sensitive management controller is operating. Consequently, while both temperature sensitive management controller and temperature insensitive thermal manager 202 are operating, both may output control signals which may conflict with each other due to the difference in management algorithms implemented by each of these devices. The status signals from these devices may be used by arbiter 204 to control which control signals are used to manage the operation of fans 210.

In an embodiment, temperature insensitive thermal manager 202 is implemented with a complex programmable logic device and/or other types of logic devices with limited functionality. Temperature insensitive thermal manager 202 may have a broader operating temperature range than temperature sensitive management controller 200. For example, temperature insensitive thermal manager 202 may operate to lower temperatures (e.g., below −20° Celsius) than temperature sensitive management controller 200 (e.g., greater than −20° Celsius). Generally, the data processing system hosting temperature insensitive thermal manager 202 may power it regardless of its temperature and ambient temperature conditions. Consequently, the control signal provided by temperature insensitive thermal manager 202 may always be present while the data processing system is operating.

Arbiter 204 may select which of the control signals are used to manage operation of fans 210. To do so, arbiter 204 may generate and provide a select signal to multiplexer 206. Arbiter 204 may generate the select signal based on the status signals from the thermal management components (e.g., 200, 202). For example, arbiter 204 may generate a select signal that selects the control signal from temperature sensitive management controller 200 while the status signal from temperature sensitive management controller 200 is present. In contrast, while the status signal from temperature sensitive management controller 200 is not present (e.g., while it is not operating) but the status signal from temperature insensitive thermal manager 202 is present, arbiter 204 may generate a select signal that selects the control signal from the temperature insensitive thermal manager 202.

In an embodiment, arbiter 204 is implemented with an integrated circuit.

Multiplexer 206 may selectively direct control signals from temperature sensitive management controller 200 or temperature insensitive thermal manager 202 based on the select signal from arbiter 204. In this manner, on one of the control signals may be used to manage the operation of fans 210. In an embodiment, multiplexer 206 is implemented with an integrated circuit.

Fan manager 208 may manage the operation of fans 210 based on the control signal directed by multiplexer 206. Fan manager 208 may include functionality to selectively direct power to any of the fans (e.g., 210A-210N) to cause the respective fan to operate at a prescribed rate (e.g., as specified by the selected control signal) and direction. For example, fan manager 208 may include functionality to selectively generate and direct pulse with modulated current signals to manage the rate and direction of operation of each of fans 210 via any number of control outputs 208A.

Additionally, fan manager 208 may include functionality to operate any of fans 210 in the absence of control signals. For example, fan manager 208 may store information regarding how fans 210 are to operate while no control signal is available (e.g., when the thermal management components (e.g., 200, 202) are not operating or the control signal is not reaching fan manager 208 for other reasons). The information may indicate, for example, default rates of operation (e.g., revolutions per minute) and direction of operation (e.g., to generate a forward or reverse flow of gas).

In an embodiment, fan manager 208 is implemented with an integrated circuit, a power supply, any number of power management controllers (e.g., power transistors), and/or other hardware components.

Fans 210 may, as noted above, generate flows of gasses. Fans 210 may be similar to fans 106 discussed above. Fans 210 may be implemented with electric motors, blades, and/or other components.

While illustrated in FIG. 2 with a limited number of specific components, a control system may include additional, fewer, and/or different components without departing from embodiments disclosed herein.

Figure 3A:
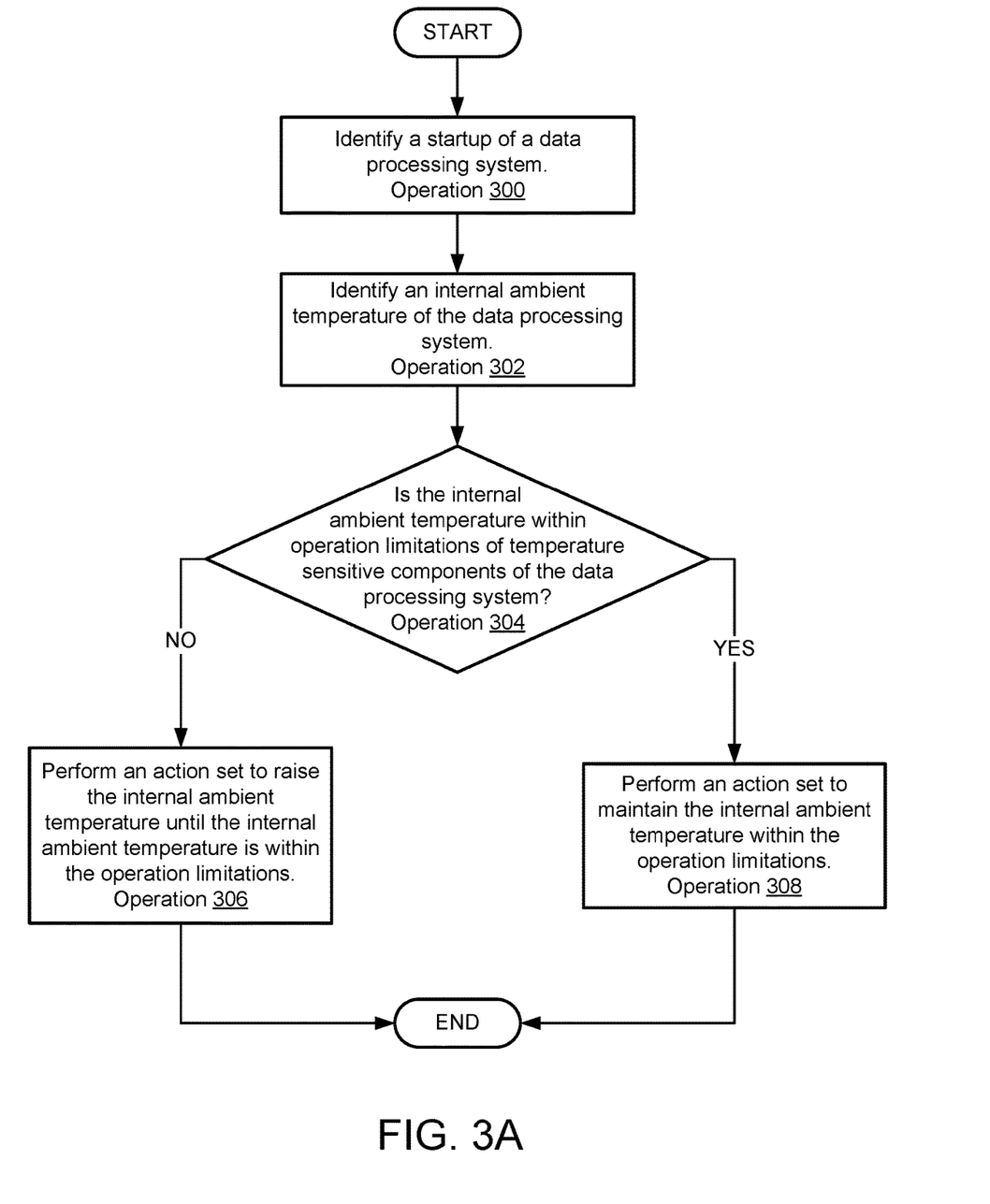
FIG. 3A shows a flow diagram illustrating a method of managing temperatures of a components of a data processing system in accordance with an embodiment.
Figure 3B:
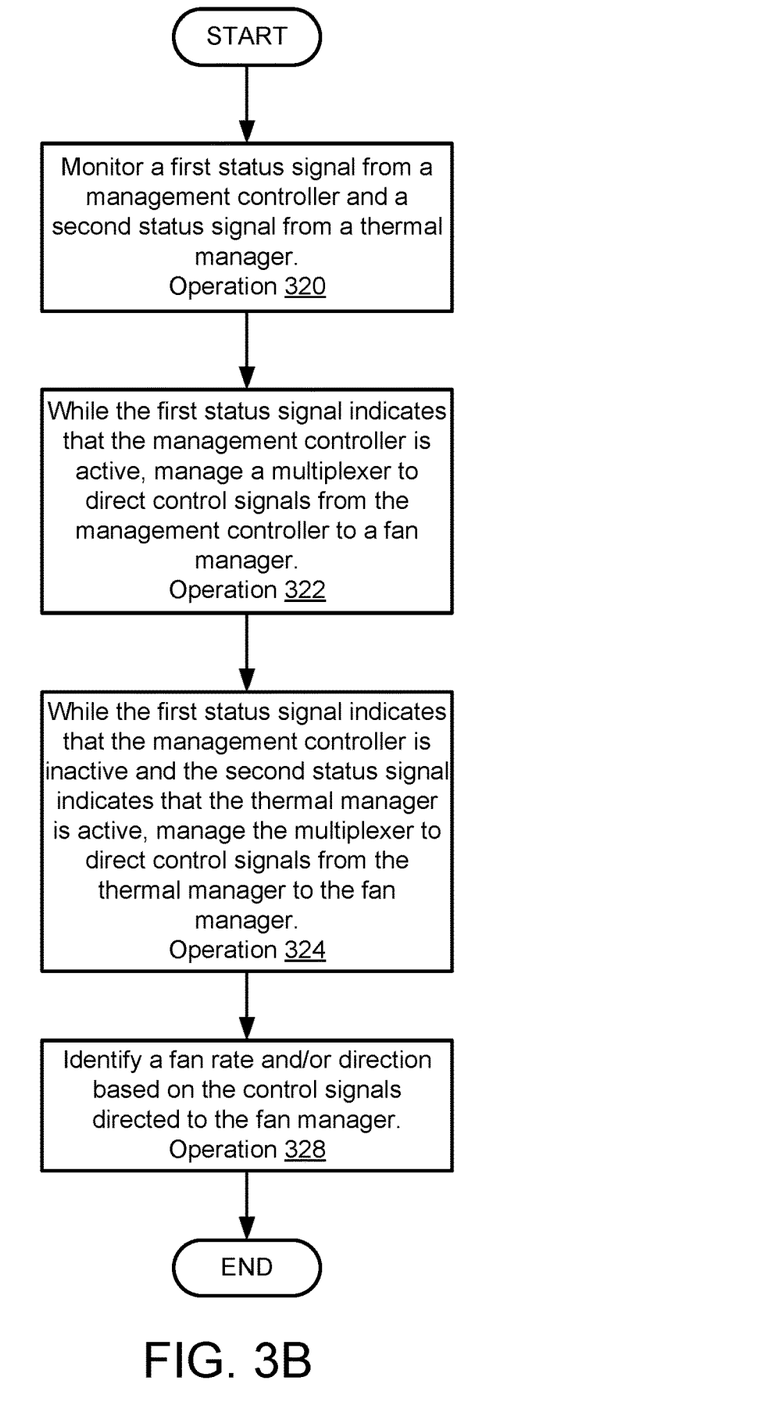
FIG. 3B shows a flow diagram illustrating a method of arbitrating control signals in accordance with an embodiment.

As discussed above, the components of FIG. 1 may perform various methods to manage the temperature of components of a data processing system. FIGS. 3A-3B illustrate examples of methods that may be performed by the components of FIG. 1A. In the diagrams discussed below and shown in FIGS. 3A-3B, any of the operations may be repeated, performed in different orders, and/or performed in a parallel or a partially overlapping in time manner with other operations.

Turning to FIG. 3A, a flow diagram illustrating a method of operating a fan for thermal management purposes in accordance with an embodiment is shown. The method may be performed, for example, by any of the components shown in FIGS. 1A and 2, and/or a power management component of a data processing system.

At operation 300, a startup of a data processing system is identified. The startup may be identified by (i) a flow of power to components of the data processing system being initiated, (ii) receiving a message (e.g., from a power supply) indicating that a power on has been initiated, and/or (iii) via other methods.

At operation 302, an internal ambient temperature of the data processing system is identified. The internal ambient temperature of the data processing system may be identified, for example, using one or more temperature sensors. The temperature sensors may output a voltage or other signal representative of the internal ambient temperature.

At operation 304, a determination is made regarding whether the internal ambient temperature is within operation limitations of temperature sensitive components of the data processing system. The termination may be made by comparing the internal ambient temperature to the operation limitations (e.g., temperature ranges) of the temperature sensor components (e.g., a temperature sensitive management controller).

If it is determined that the internal ambient temperature is within the operation limitations of the temperature sensitive components, then the method may proceed to operation 308 following operation 304. Otherwise, the method may proceed to operation 306.

At operation 306, an action set to raise the internal ambient temperature is performed until the internal ambient temperature is within the operation limitations. The action set may include, for example, powering a temperature insensitive thermal manager while not powering a temperature sensitive management controller. The temperature insensitive thermal manager may be adapted to activate fans to generate a circulation of gas within an enclosure of the data processing system while also activating a heating unit to heat the circulating gas. By doing so, the temperature sensitive management controller may be heated, and the internal ambient temperature may be raised.

The method may end following operation 306.

Returning to operation 304, the method may proceed to operation 308 when it is determined that the internal ambient temperature is within the operation limitations of the temperature sensitive components.

At operation 308, an action set to maintain the internal ambient temperature within the operation limitations is performed. The action set may include power both the temperature sensitive management controller and the temperature insensitive thermal manager. Consequently, both components may generate control signals to manage the fans and/or heating unit. To select which of the control signals to use, the method illustrated in FIG. 3B may be performed.

However, the temperature sensitive management controller may take control and manage the operation of the fans and heating unit. The temperature sensitive management controller may be adapted to identify the temperatures of the components within the data processing system and activate the fans/heating unit as necessary to maintain their temperatures within their respective operating temperate range. For example, the fans may be activated to generate airflow from an ambient environment into the data processing system, through the data processing system, and exhaust the airflow out of the data processing system.

The method may end following operation 308.

Using the method shown in FIG. 3A, embodiments disclosed herein may facilitate thermal management of components of a data processing system even while some of the management components are unable to operate due to the ambient temperature.

Turning to FIG. 3B, a flow diagram illustrating a method of managing fans in accordance with an embodiment is shown. The method may be performed, for example, by any of the components shown in FIGS. 1A and 2.

At operation 320, a first status signal from a management controller and a second status signal from a thermal manager is monitored. The status signals may be monitored by received them and tracking the signal levels. The status signals may indicate the operational states of the respective components. Consequently, the signal levels may go low when the corresponding components is not operational, and may go high when the corresponding components are operational.

In an embodiment, the thermal manager is temperature insensitive when compared to the management controller. Consequently, the thermal manager may be operational across a wider range of thermal conditions when compared to the management controller.

At operation 322, while the first status signal indicates that the management controller is active (e.g., operational), a multiplexer may be managed to direct control signals from the management controller to a fan manager. The multiplexer may be managed by providing a select signal to the multiplexer. The select signal may be adapted to cause the multiplexer to output the control signals from the management controller to the fan manager. For example, an arbiter may generate the select signal based on the status signals from the management controller and thermal manager.

At operation 324, while the first status signal indicates that the management controller is inactive and the second status signal indicates that the thermal manager is active, manage the multiplexer to direct control signals from the thermal manager to the fan manager. The multiplexer may be managed by providing a select signal to the multiplexer, as noted above. The select signal may be adapted to cause the multiplexer to output the control signals from the thermal manager to the fan manager. For example, an arbiter may generate the select signal based on the status signals from the management controller and thermal manager.

At operation 328, a fan rate and/or direction is identified based on the control signals directed to the fan manager. The fan rate and/or direction may be identified by, for example, (i) performing a lookup in a table that specifies the fan rate and/or direction based on the control signals, (ii) driving an amplifier or other device using the control signals, and/or (iii) via other methods.

Once identified, the fan rate and/or direction may be used to power a fan to cause the fan to conform its operation based on the fan rate and/or direction. While described with respect to a single fan, it will be appreciated that any number of control signals may be used to manage the operation of any number of fans.

For example, control signals may be used to drive fans to generate a circulation or flow through of airflow in a data processing system. These airflows may be used in conjunction with heating units to thermally manage the components of a data processing system across a broad variety of environmental conditions.

The method may end following operation 328.

Figure 4:
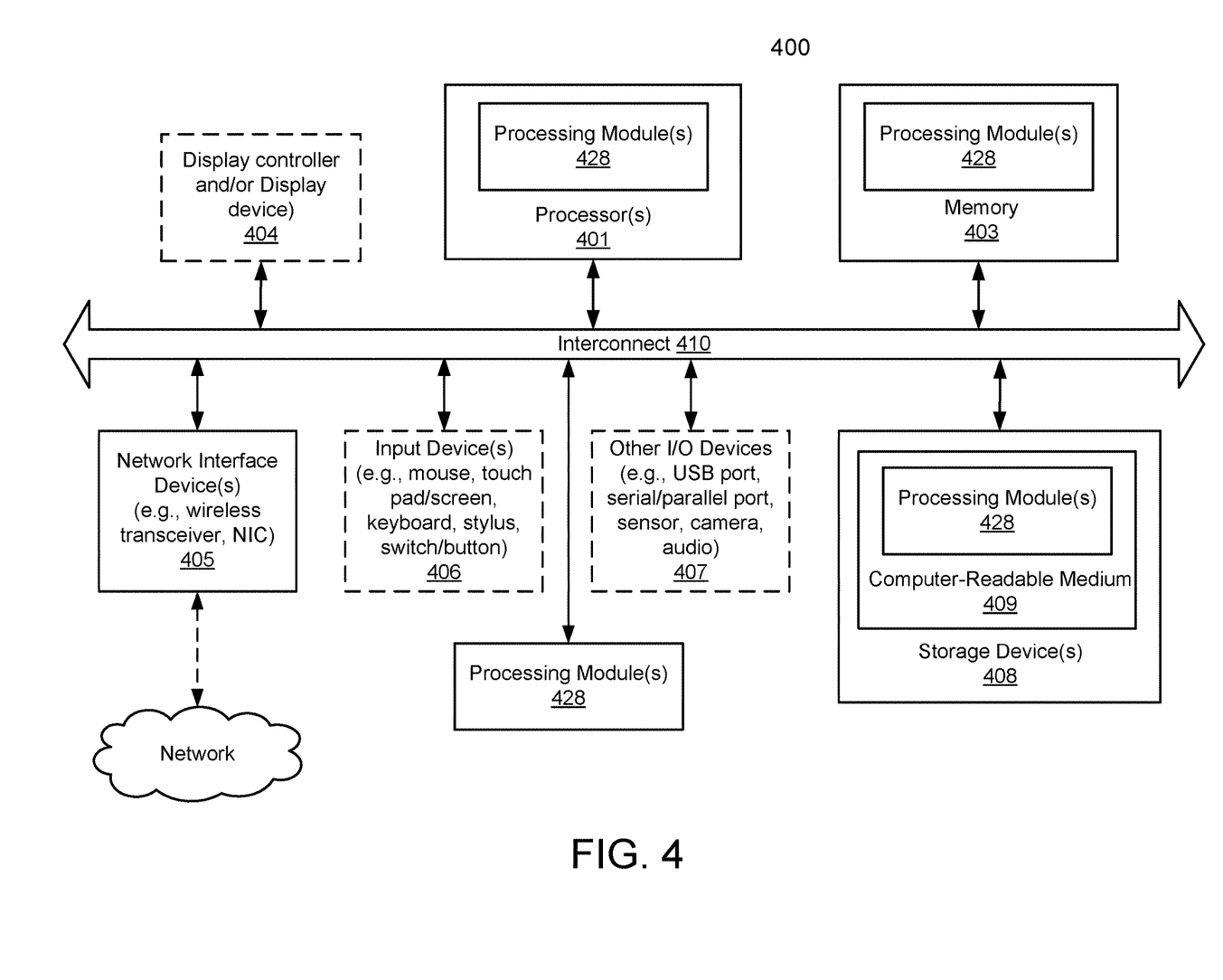
FIG. 4 shows a block diagram illustrating a data processing system in accordance with an embodiment.

Any of the components illustrated in FIGS. 1A-1D may be implemented with one or more computing devices. Turning to FIG. 4, a block diagram illustrating an example of a data processing system (e.g., a computing device) in accordance with an embodiment is shown. For example, system 400 may represent any of data processing systems described above performing any of the processes or methods described above. System 400 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 400 is intended to show a high level view of many components of the computer system. However, it is to be understood that additional components may be present in certain implementations and furthermore, different arrangement of the components shown may occur in other implementations. System 400 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 400 includes processor 401, memory 403, and devices 405-408 via a bus or an interconnect 410. Processor 401 may represent a single processor or multiple processors with a single processor core or multiple processor cores included therein. Processor 401 may represent one or more general-purpose processors such as a microprocessor, a central processing unit (CPU), or the like. More particularly, processor 401 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 401 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 401, which may be a low power multi-core processor socket such as an ultra-low voltage processor, may act as a main processing unit and central hub for communication with the various components of the system. Such processor can be implemented as a system on chip (SoC). Processor 401 is configured to execute instructions for performing the operations discussed herein. System 400 may further include a graphics interface that communicates with optional graphics subsystem 404, which may include a display controller, a graphics processor, and/or a display device.

Processor 401 may communicate with memory 403, which in one embodiment can be implemented via multiple memory devices to provide for a given amount of system memory. Memory 403 may include one or more volatile storage (or memory) devices such as random access memory (RAM), dynamic RAM (DRAM), synchronous DRAM (SDRAM), static RAM (SRAM), or other types of storage devices. Memory 403 may store information including sequences of instructions that are executed by processor 401, or any other device. For example, executable code and/or data of a variety of operating systems, device drivers, firmware (e.g., input output basic system or BIOS), and/or applications can be loaded in memory 403 and executed by processor 401. An operating system can be any kind of operating systems, such as, for example, Windows® operating system from Microsoft®, Mac OS®/iOS® from Apple, Android® from Google®, Linux®, Unix®, or other real-time or embedded operating systems such as VxWorks.

System 400 may further include IO devices such as devices (e.g., 405, 406, 407, 408) including network interface device(s) 405, optional input device(s) 406, and other optional IO device(s) 407. Network interface device(s) 405 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 406 may include a mouse, a touch pad, a touch sensitive screen (which may be integrated with a display device of optional graphics subsystem 404), a pointer device such as a stylus, and/or a keyboard (e.g., physical keyboard or a virtual keyboard displayed as part of a touch sensitive screen). For example, input device(s) 406 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 407 may include an audio device. An audio device may include a speaker and/or a microphone to facilitate voice-enabled functions, such as voice recognition, voice replication, digital recording, and/or telephony functions. Other IO devices 407 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 407 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 410 via a sensor hub (not shown), while other devices such as a keyboard or thermal sensor may be controlled by an embedded controller (not shown), dependent upon the specific configuration or design of system 400.

To provide for persistent storage of information such as data, applications, one or more operating systems and so forth, a mass storage (not shown) may also couple to processor 401. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 401, e.g., via a serial peripheral interface (SPI). This flash device may provide for non-volatile storage of system software, including a basic input/output software (BIOS) as well as other firmware of the system.

Storage device 408 may include computer-readable storage medium 409 (also known as a machine-readable storage medium or a computer-readable medium) on which is stored one or more sets of instructions or software (e.g., processing module, unit, and/or processing module/unit/logic 428) embodying any one or more of the methodologies or functions described herein. Processing module/unit/logic 428 may represent any of the components described above. Processing module/unit/logic 428 may also reside, completely or at least partially, within memory 403 and/or within processor 401 during execution thereof by system 400, memory 403 and processor 401 also constituting machine-accessible storage media. Processing module/unit/logic 428 may further be transmitted or received over a network via network interface device(s) 405.

Computer-readable storage medium 409 may also be used to store some software functionalities described above persistently. While computer-readable storage medium 409 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Processing module/unit/logic 428, components and other features described herein can be implemented as discrete hardware components or integrated in the functionality of hardware components such as ASICS, FPGAs, DSPs or similar devices. In addition, processing module/unit/logic 428 can be implemented as firmware or functional circuitry within hardware devices. Further, processing module/unit/logic 428 can be implemented in any combination hardware devices and software components.

Note that while system 400 is illustrated with various components of a data processing system, it is not intended to represent any particular architecture or manner of interconnecting the components; as such details are not germane to embodiments of the present invention. It will also be appreciated that network computers, handheld computers, mobile phones, servers, and/or other data processing systems which have fewer components or perhaps more components may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments of the invention as described herein.

In the foregoing specification, embodiments have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A data processing system to provide computer implemented services, the data processing system comprising:
   hardware resources for providing the computer implemented services;
   a heating unit adapted to selectively heat an interior of an enclosure in which the hardware resources are positioned;
   fans adapted to selectively generate airflow from an ambient environment through the enclosure;
   a fan controller adapted to manage operation of the fans and operation of the heating unit based on instructions from a temperature sensitive management controller or a temperature insensitive thermal manager;
   the temperature sensitive management controller, the temperature sensitive management controller being adapted to provide the instructions to the fan controller while the temperature sensitive management controller is operating; and
   the temperature insensitive thermal manager, the temperature insensitive thermal manage being adapted to direct, by providing the instructions to the fan controller, the operation of the heating unit and the operation of the fans while an internal ambient temperature of the data processing system is outside of operation limitations of the temperature sensitive management controller,
   wherein the temperature sensitive management controller is separate from the temperature insensitive thermal manager, and the fan controller is separate from both the temperature sensitive management controller and the temperature insensitive thermal manager.

2. The data processing system of claim 1, further comprising:
   an arbiter adapted to establish an operation connection between one of the temperature sensitive management controller and the temperature insensitive thermal manager to the fan controller at a time, wherein the operable connection allows the instructions to be obtained by the fan controller.

3. The data processing system of claim 2, further comprising:
   a multiplexer that selectively directs first signals from the temperature sensitive management controller to the fan controller or second signals from the temperature insensitive thermal manager to the fan controller,
   the multiplexer receiving a select signal from the arbiter to select which of the first signals and the second signals to direct to the fan controller at a time.

4. The data processing system of claim 3, wherein operably connecting one of the one of the temperature sensitive management controller and the temperature insensitive thermal manager comprises:
   identifying an operating state of the temperature sensitive management controller and the temperature insensitive thermal manager;
   when, based on the operating state, the temperature sensitive management controller is operational, modifying the select signal to select the first signals for direction to the fan controller; and
   when, based on the operating state, the temperature sensitive management controller is not operation and the temperature insensitive thermal manager is operational, modifying the select signal to select the second signals for direction to the fan controller.

5. The data processing system of claim 1, wherein the fan controller comprises:
   a plurality of independent control outputs operably connected to the fans, the control outputs facilitating speed and direction of airflows generated by the fans.

6. The data processing system of claim 5, wherein the fans comprise a pair of circulation fans for generating a circulatory airflow within the interior.

7. The data processing system of claim 6, wherein the pair of circulation fans are positioned with each other and to generate airflows in different directions when operating.

8. The data processing system of claim 7, wherein the pair of circulation fans is positioned with a gas intake in the enclosure or a gas exhaust in the enclosure.

9. The data processing system of claim 1, wherein directing, by providing the instructions to the fan controller, the operation of the heating unit and the operation of the fans comprises:
   making a determination that an instance of the internal ambient temperature is outside of the operation limitations of the temperature sensitive management controller;
   based on the determination:
      sending first instructions to the fan controller, the first instructions directing a first fan of the fans to operate in a first direction to generate a first airflow;
      sending second instructions to the fan controller, the second instructions directing a second fan of the fans to operating in a second direction to generate a second airflow; and
      initiating heat generation via the heating unit while the first airflow and the second airflow are generated.

10. The data processing system of claim 9, wherein the first fan and the second fan are positioned so that the first airflow and the second airflow generate a circulation airflow within the interior of the enclosure, the circulation airflow being heated by the heat generation by the heating unit to warm, at least, the temperature sensitive management controller.

11. The data processing system of claim 10, wherein the temperature sensitive management controller is inactive while the first airflow and the second airflow are generated.

12. The data processing system of claim 1, wherein providing the instructions to the fan controller while the temperature sensitive management controller is operating comprises:
- obtaining a hardware component inventory of the data processing system;
- selecting, based on the hardware component inventory, operating set points for the fans to establish an airflow through the interior that prioritizes heating or cooling a temperature sensitive hardware indicated within the hardware component inventory to an operating temperature range of the temperature sensitive hardware; and
- sending the instructions, that are based on the operating set points, to the fan controller via a multiplexer of the data processing system, the multiplexer multiplexing communications from the temperature sensitive management controller and the temperature insensitive thermal manager to the fan controller.

13. The data processing system of claim 1, further comprising:
- a multiplexer that selectively directs first signals from the temperature sensitive management controller to the fan controller or second signals from the temperature insensitive thermal manager to the fan controller,
- the multiplexer receiving a select signal from at least one component installed within the data processing system that is configured as an arbiter to select which of the first signals and the second signals to direct to the fan controller at a time.

14. The data processing system of claim 13, wherein providing the instructions to the fan controller while the temperature sensitive management controller is operating comprises:
- obtaining a hardware component inventory of the data processing system;
- selecting, based on the hardware component inventory, operating set points for the fans to establish an airflow through the interior that prioritizes heating or cooling a temperature sensitive hardware indicated within the hardware component inventory to an operating temperature range of the temperature sensitive hardware; and
- sending the instructions, that are based on the operating set points, to the fan controller via a multiplexer of the data processing system, the multiplexer multiplexing communications from the temperature sensitive management controller and the temperature insensitive thermal manager to the fan controller.

15. The data processing system of claim 1, further comprising:
- a multiplexer that selectively directs first signals from the temperature sensitive management controller to the fan controller.

16. The data processing system of claim 15, wherein the multiplexer further selectively directs second signals from the temperature insensitive thermal manager to the fan controller.

17. The data processing system of claim 1, wherein the fans comprise a pair of circulation fans for generating a circulatory airflow within the interior.

18. The data processing system of claim 17, wherein the pair of circulation fans are positioned with each other and to generate airflows in different directions when operating.

19. The data processing system of claim 18, wherein the pair of circulation fans is positioned with a gas intake in the enclosure or a gas exhaust in the enclosure.

20. The data processing system of claim 17, wherein the pair of circulation fans is positioned with a gas intake in the enclosure or a gas exhaust in the enclosure.

* * * * *